United States Patent
Richter et al.

(10) Patent No.: US 11,772,959 B2
(45) Date of Patent: *Oct. 3, 2023

(54) MEMS DEVICE WITH IMPROVED DYNAMIC MECHANICAL PERFORMANCE THROUGH DAMPING BY LOCALIZED VISCOELASTIC MEDIUM

(71) Applicant: Mirrorcle Technologies, Inc., Richmond, CA (US)

(72) Inventors: Stefan Richter, Jena (DE); Johannes Kindt, Weimar (DE); Veljko Milanovic, Richmond, CA (US)

(73) Assignee: MIRRORCLE TECHNOLOGIES, INC., Richmond, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/940,770

(22) Filed: Sep. 8, 2022

(65) Prior Publication Data
US 2023/0002215 A1    Jan. 5, 2023

Related U.S. Application Data

(63) Continuation of application No. 16/632,511, filed as application No. PCT/EP2018/068892 on Jul. 12, 2018.
(Continued)

(30) Foreign Application Priority Data

Jul. 21, 2017  (DE) .......................... 10201707002.4

(51) Int. Cl.
*B81B 3/00*  (2006.01)
*H02N 1/00*  (2006.01)

(52) U.S. Cl.
CPC ............ *B81B 3/0078* (2013.01); *H02N 1/008* (2013.01); *B81B 2201/04* (2013.01); *B81B 2203/0154* (2013.01); *B81B 2203/058* (2013.01)

(58) Field of Classification Search
CPC .............. B81B 3/0078; B81B 2201/04; B81B 2203/0154; B81B 2203/058; B81B 2201/045; H02N 1/008
See application file for complete search history.

(56) References Cited

U.S. PATENT DOCUMENTS

| 5,322,258 A | 6/1994 | Bosch et al. |
| 6,168,395 B1 | 1/2001 | Quenzer et al. |

(Continued)

FOREIGN PATENT DOCUMENTS

WO    WO-0195468 A1 * 12/2001 ........... B81B 3/0051

OTHER PUBLICATIONS

International Search Report and Written Opinion dated Oct. 19, 2018 for International Patent Application No. PCT/EP2018/068892.
(Continued)

*Primary Examiner* — Bernard Rojas
(74) *Attorney, Agent, or Firm* — JDI PATENT; Joshua Isenberg; Robert Pullman

(57) ABSTRACT

MEMS devices include a suspended element connected to a fixed part of a substrate by one or more flexures, wherein the one or more flexures are configured to permit movement of the suspended element relative to a fixed part of the substrate. An actuator coupled to the suspended element and a damping structure coupled to the suspended element extends into a gap between the suspended element and the fixed part of the substrate. One or more fluid confinement structures are configured to permit movement of the damping structure
(Continued)

within a limited portion of the gap and to confine a viscoelastic fluid to the limited portion of the gap.

33 Claims, 12 Drawing Sheets

Related U.S. Application Data

(60) Provisional application No. 62/535,390, filed on Jul. 21, 2017.

(56) References Cited

U.S. PATENT DOCUMENTS

| | | | |
|---|---|---|---|
| 6,771,081 B2 | 8/2004 | Borwick, III et al. | |
| 2002/0153804 A1 | 10/2002 | Hirano et al. | |
| 2003/0094881 A1 | 5/2003 | Grade et al. | |
| 2003/0218283 A1* | 11/2003 | Yasumura | G02B 26/0841 267/136 |
| 2005/0195464 A1* | 9/2005 | Faase | G02B 1/06 359/291 |

OTHER PUBLICATIONS

Non-Final Office Action for U.S. Appl. No. 16/632,511, dated Mar. 2, 2022.

Notice of Allowance for U.S. Appl. No. 16/632,511, dated Jul. 14, 2022.

* cited by examiner

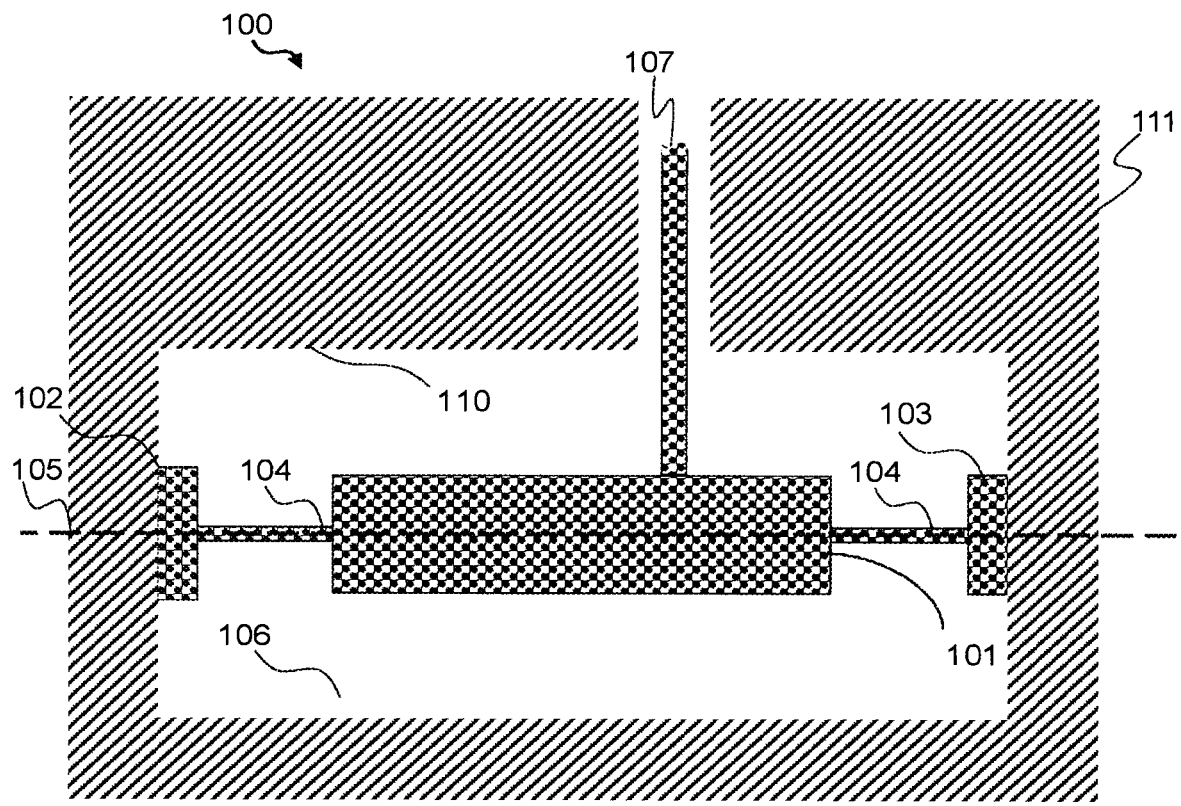
Fig. 1
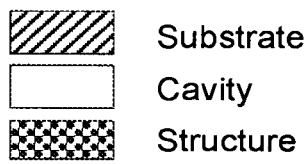 Substrate
Cavity
Structure

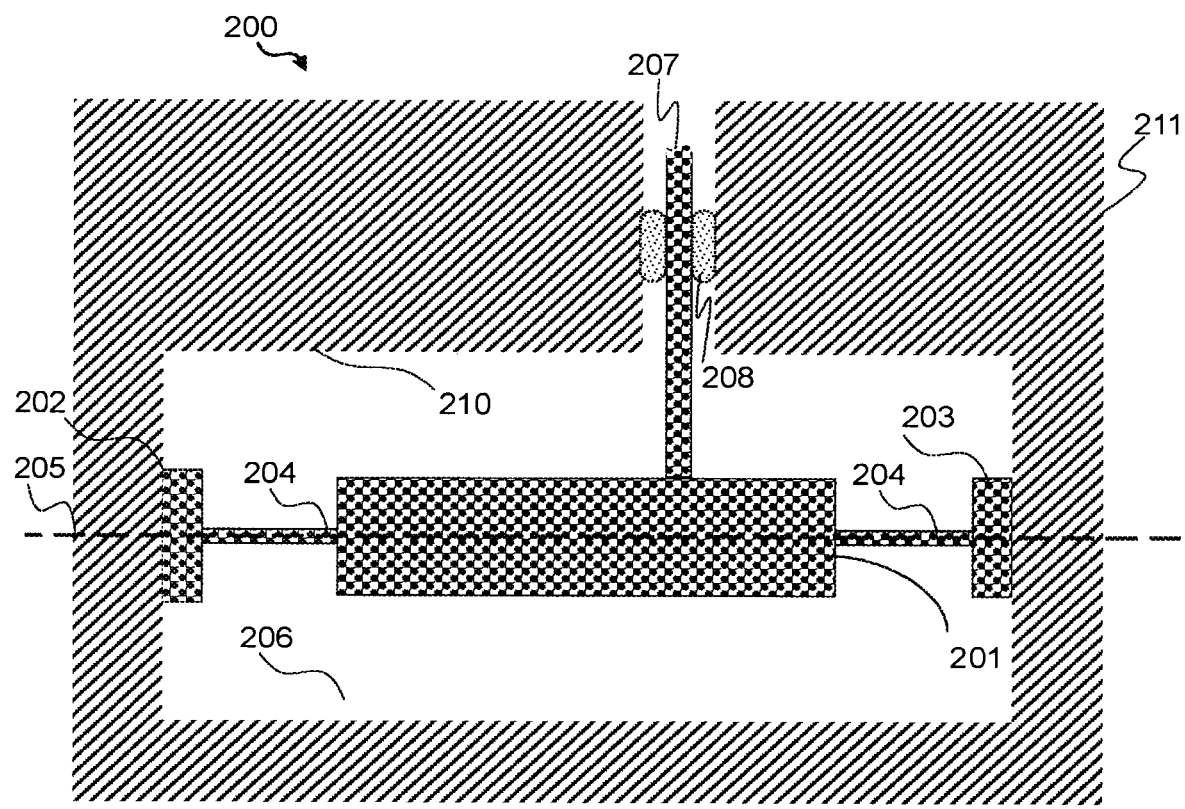
Fig. 2
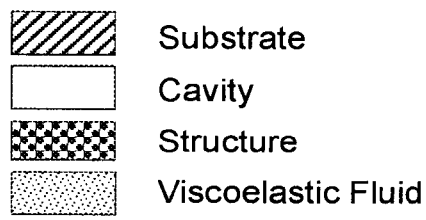

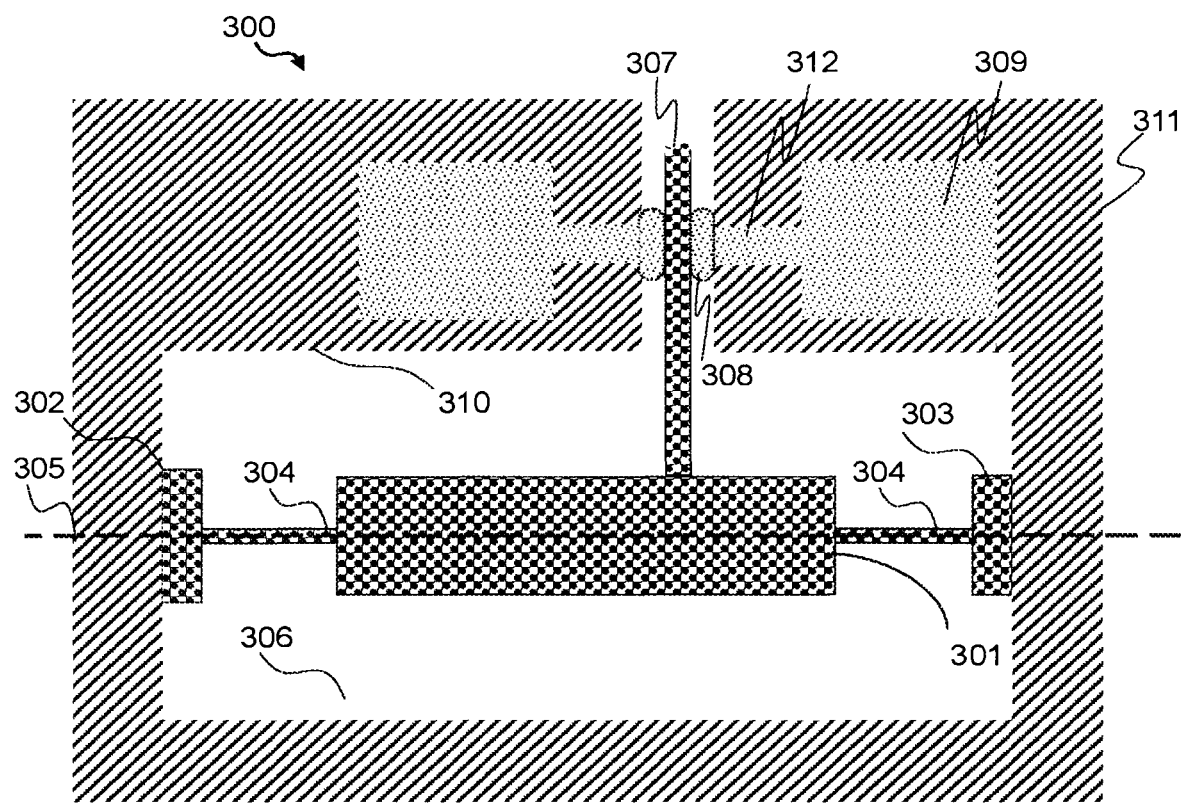
Fig. 3
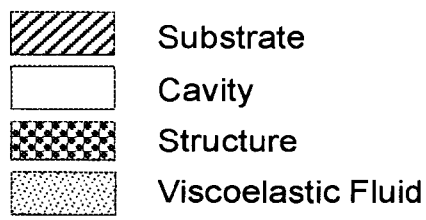
Substrate
Cavity
Structure
Viscoelastic Fluid

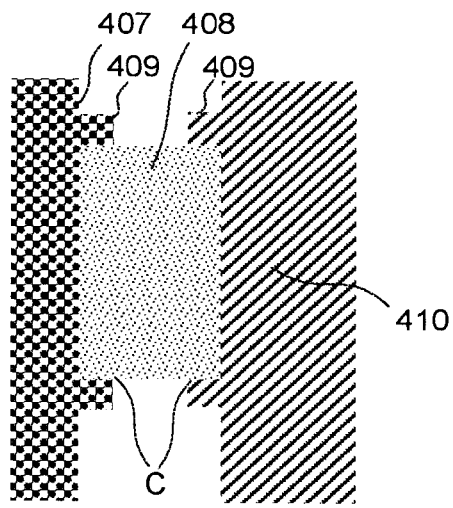
Fig. 4 A
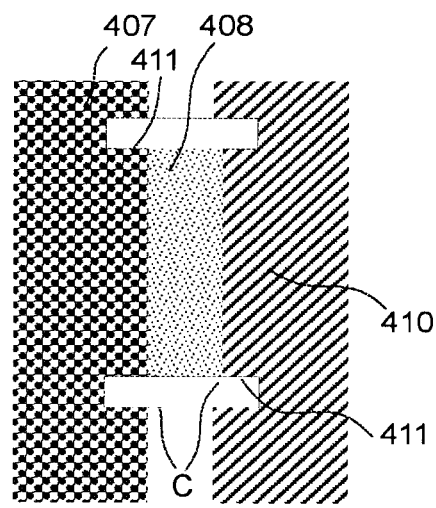
Fig. 4 B
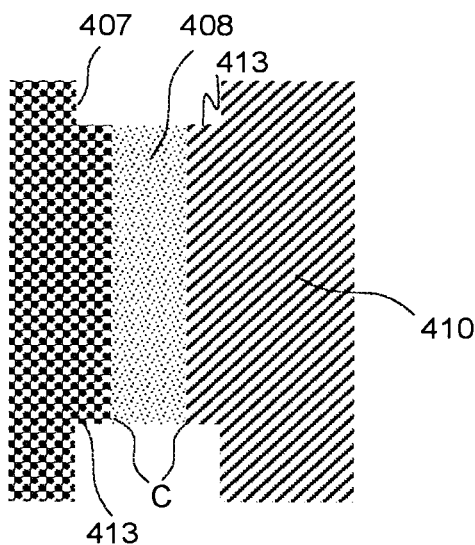
Fig. 4 C
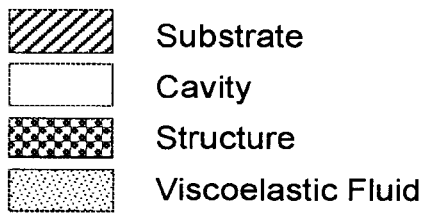

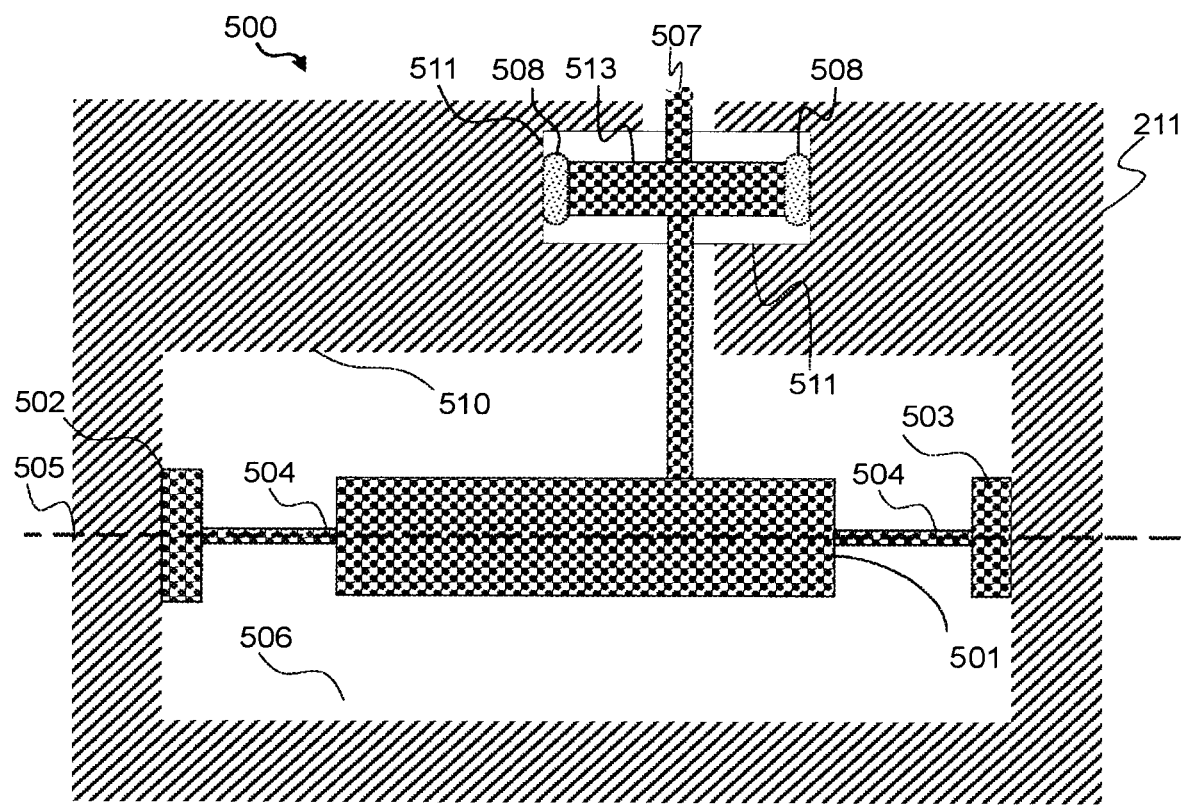
Fig. 5
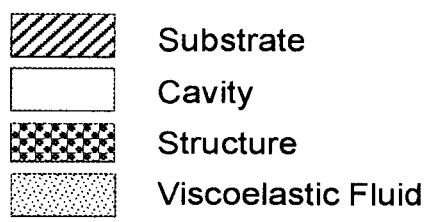

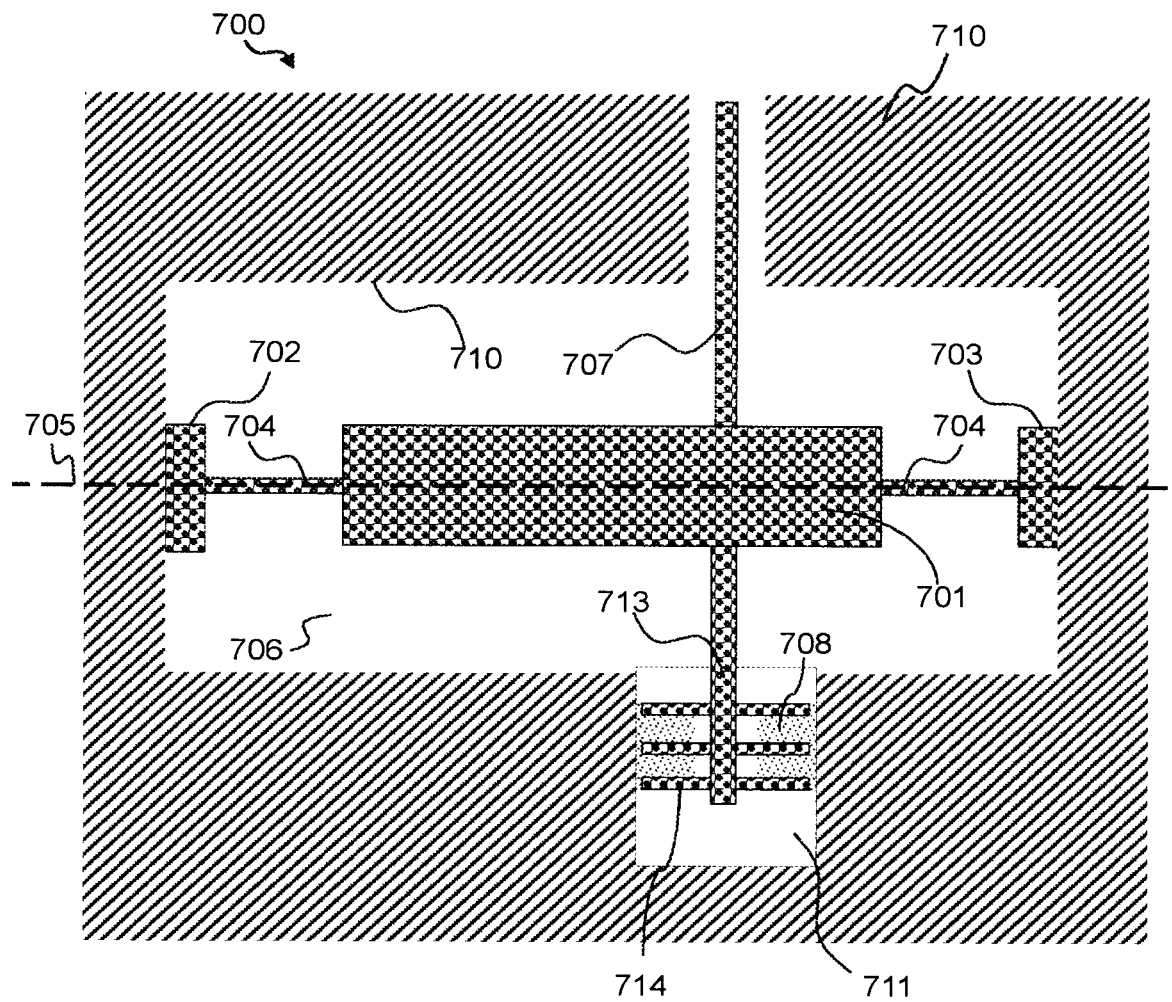
Fig. 7
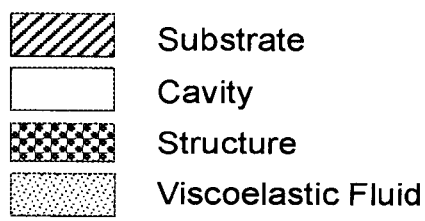
Substrate
Cavity
Structure
Viscoelastic Fluid

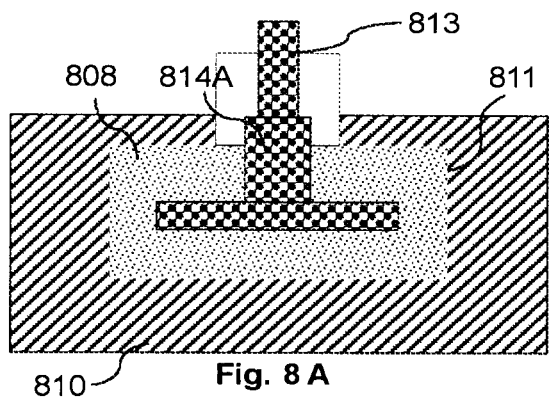
Fig. 8 A
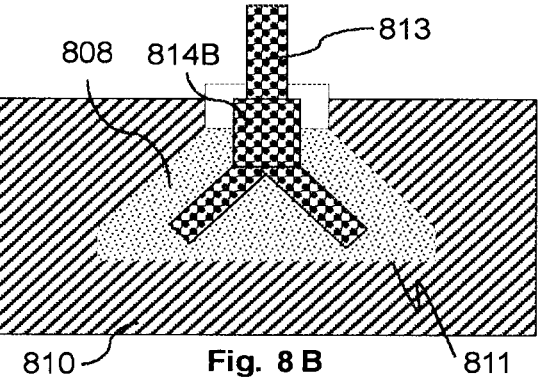
Fig. 8 B
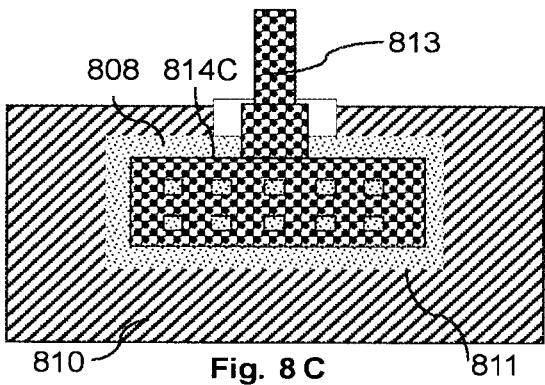
Fig. 8 C
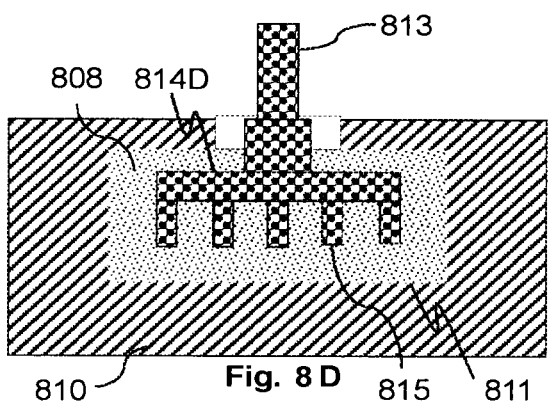
Fig. 8 D
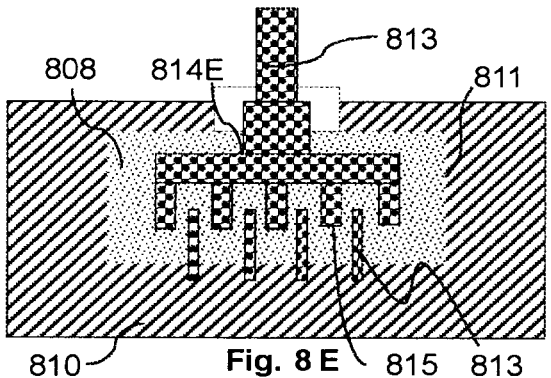
Fig. 8 E
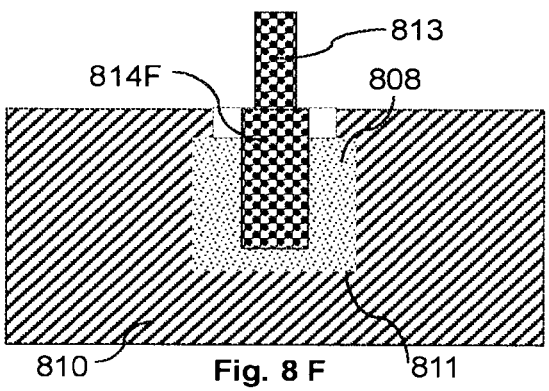
Fig. 8 F
 Substrate    Fluid    Structure

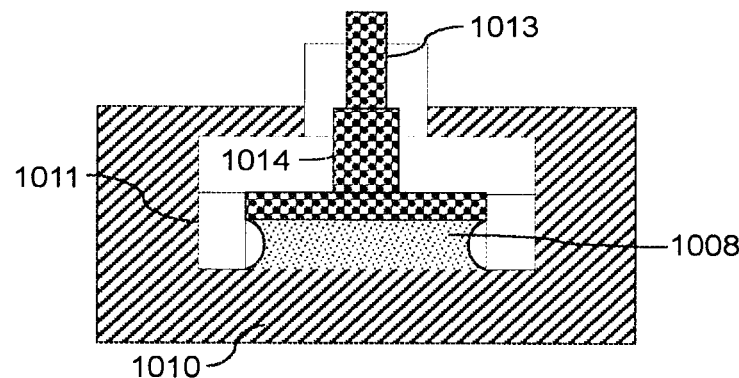
Fig. 10 A
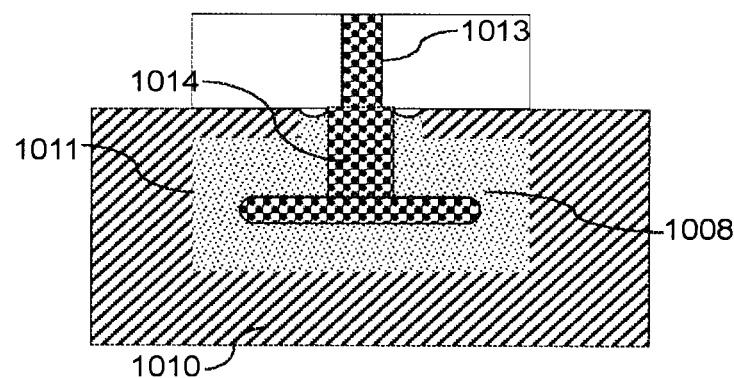
Fig. 10 B
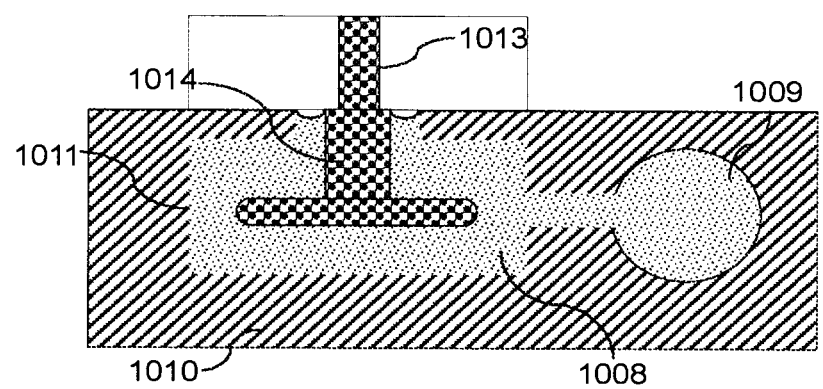
Fig. 10 C
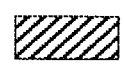 Substrate  Cavity
 Structure  Viscoelastic Fluid

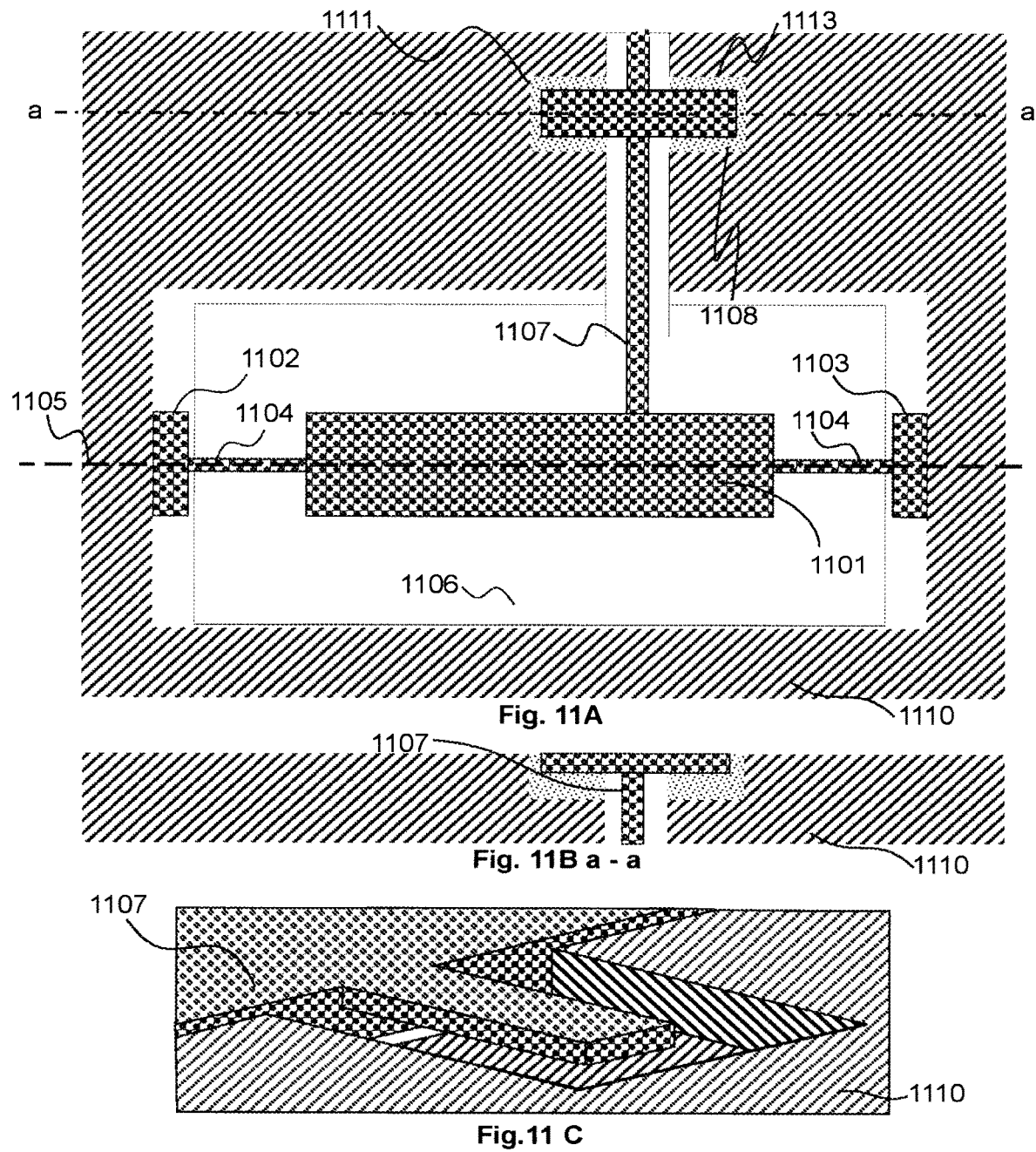
Fig. 11A
Fig. 11B a-a
Fig. 11 C
|  Substrate |  Cavity |
| --- | --- |
|  Structure |  Viscoelastic Fluid |

# MEMS DEVICE WITH IMPROVED DYNAMIC MECHANICAL PERFORMANCE THROUGH DAMPING BY LOCALIZED VISCOELASTIC MEDIUM

CLAIM OF PRIORITY

This application is a continuation of U.S. patent application Ser. No. 16/632,511 filed Jan. 20, 2020 to Stefan Richter. The entire content of which are incorporated herein by reference.

U.S. patent application Ser. No. 16/632,511 is a national stage application of International Application No. PCT/EP2018/068892 filed Jul. 12, 2018 to Stefan Richter. The entire content of which are incorporated herein by reference.

International Application No. PCT/EP2018/068892 claims the benefit of priority from U.S. Provisional Application No. 62/535,390 filed Jul. 21, 2017 to Stefan Richter. The entire content of which are incorporated herein by reference.

FIELD OF THE DISCLOSURE

The present disclosure relates to micro-electro-mechanical-system (MEMS) devices, in particular actuators and improvements to the dynamic mechanical performance of these devices through damping by a localized viscoelastic medium.

BACKGROUND OF THE DISCLOSURE

Micro-Electro-Mechanical-System (MEMS) devices are micro-sized electro-mechanical structures fabricated by various microfabrication processes mostly derived from integrated circuit fabrication. Such systems sometimes also include electronic circuits fabricated together with mechanical structures to perform a complete function, e.g., a sensor or actuator function. The developments in the field of MEMS allow for the bulk production of microelectromechanical scanning mirrors and scanning mirror arrays that can be used in all-optical cross connect switches, 1×N, N×N optical switches, variable optical attenuators, laser displays, bio-medical imaging, etc.

In some MEMS applications it is useful to incorporate viscoelastic damping of mechanical structures.

It is within this context that aspects of the present disclosure arise.

BRIEF DESCRIPTION OF THE DRAWINGS

FIG. 1 is a schematic top-view diagram illustrating a microstructure suspended over an etched cavity such as e.g. an electrostatic MEMS rotator in accordance with certain aspects of the present disclosure.

FIG. 2 is a schematic top-view diagram illustrating the microstructure of FIG. 1 with a drive beam for actuating another part of a device, showing possible locations viscoelastic fluid on either side of a drive beam in accordance with certain aspects of the present disclosure.

FIG. 3 is a schematic top-view diagram illustrating an alternative microstructure incorporating reservoirs for viscoelastic fluid on either side of a drive beam in accordance with certain aspects of the present disclosure.

FIGS. 4A-4C are schematic top-view diagrams illustrating possible structures for local confinement of viscoelastic fluid in a MEMS device in accordance with certain aspects of the present disclosure.

FIG. 5 is a schematic top-view diagram illustrating a rotator and location where one or more damping structures (winglets) are attached to sides of a drive beam in accordance with certain aspects of the present disclosure.

FIG. 7 is a schematic top-view diagram illustrating a rotator and location where viscoelastic fluid is confined by comb-like structures on the sides of a beam that extends from a rotator shuttle on a side that is opposite to the side to which the drive beam is attached in accordance with certain aspects of the present disclosure.

FIG. 8A-8F are schematic top-view diagrams of six different damping structures in accordance with certain aspects of the present disclosure.

FIGS. 10A-10C are schematic top-view diagrams illustrating different examples of confinement of viscoelastic fluid utilizing T-shaped damping structures in accordance with aspects of the present disclosure.

FIG. 11A is a schematic top-view diagram of a portion of a MEMS device utilizing damping structures in conjunction with confinement of viscoelastic fluid in accordance with aspects of the present disclosure.

FIG. 11B is a schematic cross-sectional view taken along line a-a of FIG. 11A.

FIG. 11C is a close-up three-dimensional schematic view of a part of the device depicted in FIG. 11A.

DETAILED DESCRIPTION OF THE PREFERRED EMBODIMENTS

Introduction

Figure 6:
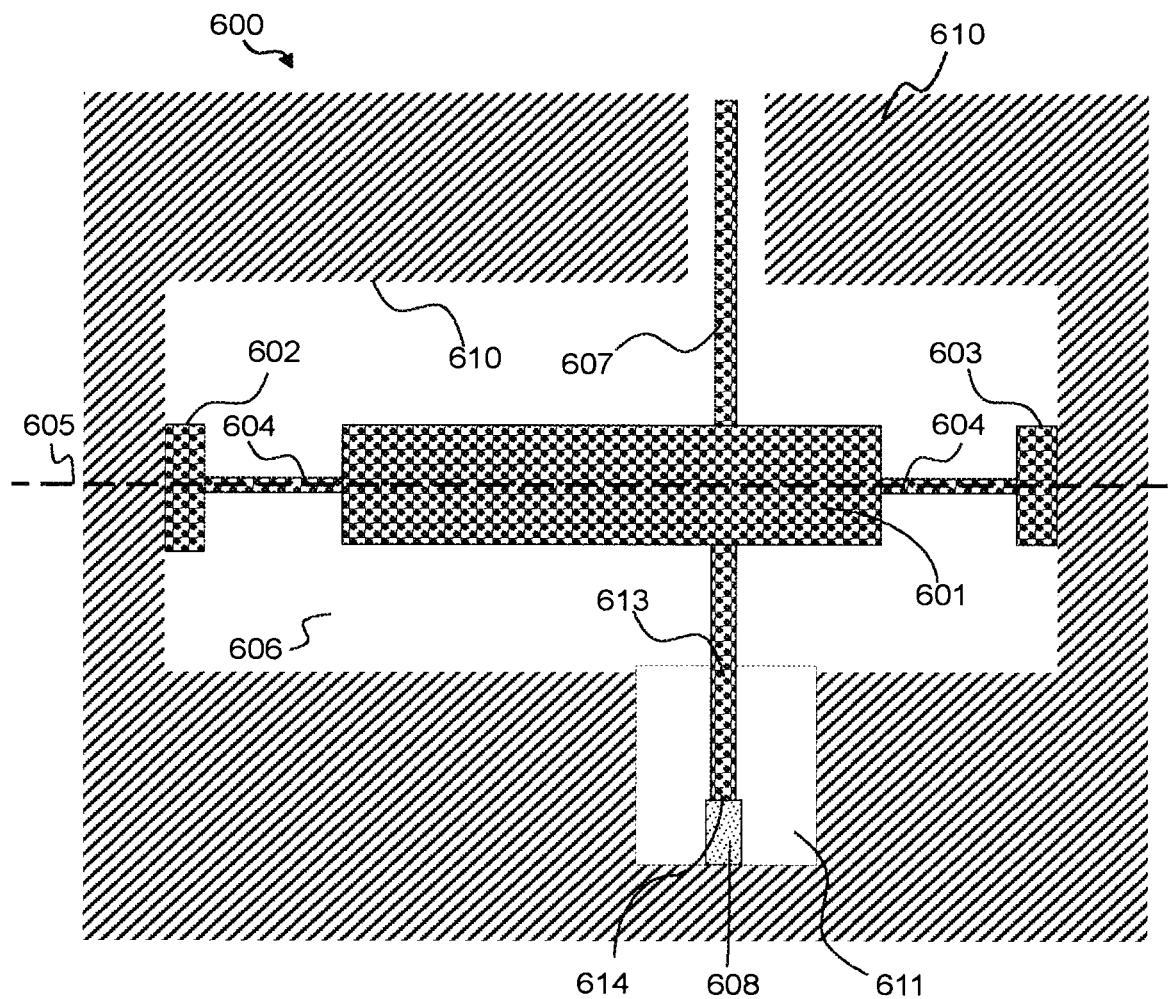
FIG. 6 is a schematic top-view diagram illustrating a rotator and location where a damping structure on the end of a beam that extends from a rotator shuttle on a side that is opposite to the side to which the drive beam is attached in accordance with certain aspects of the present disclosure.
Figure 6:
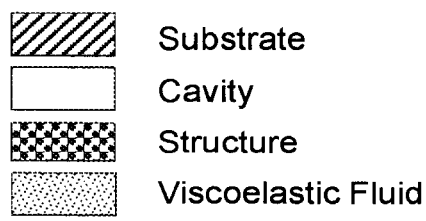

A typical MEMS device includes a substrate, typically made of crystalline silicon and a suspended element, which is often formed from a portion of the substrate using integrated circuit fabrication techniques. The suspended element is connected to a fixed part of the substrate by one or more flexures, which may also be formed from a portion of the substrate. The flexures are typically made long and thin to permit movement of the suspended element relative to a fixed part of the substrate. A drive beam connected to the suspended element provides a mechanical contact to an actuator, which may be a comb-drive actuator, a gap-closing actuator or other type of actuator. In some actuator designs, components of the actuator may also be fabricated from a portion of the substrate.

FIG. 1 is a simplified schematic top-view diagram of an example of a MEMS device 100 in which a microstructure which is suspended over an etched cavity and is able to mechanically actuate in rotation or in other degrees of freedom. Specifically, a suspended element 101 includes a large stiff portion that is tethered to anchors 102 and 103 via flexures 104, e.g., in the form of torsion springs, which allow the suspended element 101 (also referred to as rotator) to rotate about an axis 105, but mostly constrains the suspended element from lateral or vertical translation and rotation in all other directions. The diagram shows the top view of the structure which is typically defined by a photomask in a silicon etching process. Its thickness into the page of the figure is typically uniform, e.g. about 50 microns (μm), and is defined by the thickness of the silicon layer that is etched to form the rotator and, typically but not invariably, the anchors 102, 103 and flexures 104. In a typical embodiment the thickness of the rotator is the thickness of an SOI wafer device layer. The anchors 102 and 103 are attached to a fixed part 110 of substrate 111, e.g., a SOI wafer handle layer. This fixed part 110 has a cavity 106 etched into it to allow the MEMS rotator structure its movement. The device shown in FIG. 1 may be used to provide some actuating force to another part of the MEMS device such as e.g. a MEMS mirror. A drive beam 107, which is also suspended over the etched cavity 106, conveys the rotation of the rotator shuttle 101 to a remotely attached structure (e.g. a MEMS mirror) which is not shown in the figure. The drive beam 107 may also be formed from the same substrate as the suspended element 101. It should be noted that the rotation can be imparted to the suspended element by electrostatic, electromagnetic, thermal, or other means, the details of which are also not shown in FIG. 1.

The MEMS rotator as schematically shown in FIG. 1 is typically used in standard air environment, at nearly 1 atm of pressure and room temperature. In special cases with hermetic packaging it may be surrounded with a different backfill gas such as N2, SF6, etc, or at different pressures. In all cases of nearly atmospheric pressure conditions the structure's mechanical damping is typically dominated by losses to the surrounding fluid (gas, air). These losses are relatively very low and therefore the structures typically have very high quality factors on the order of 100. Thus, they can be difficult to control when actuated as it is easy to initiate resonant/ringing response. Furthermore this results in high susceptibility to shock and vibrations which is not desired. Therefore, it is desired to lower the quality factor of the structure by increasing damping by mechanical means, possibly providing nearly critical underdamping or even exactly critical damping with Q=0.5.

To provide desired mechanical properties, a viscoelastic medium is sometimes incorporated into a gap between gap between sidewalls of both the fixed part of the substrate and either the suspended element or the drive beam or both the suspended element and drive beam. The viscoelastic medium provides a damping mechanism that controls mechanical properties such as resonance. The amount of damping is difficult to control.

The viscoelastic medium may be a silicone-based gel or oil or another type of viscoelastic gel or fluid. The choice of medium can be based on a number of important parameters of performance. Firstly the material should be possible to dispense in correct quantities to the appropriate locations on the device, therefore its viscosity cannot be too high. Secondly, the material should have a favorable viscoelastic damping "tangent delta" (tan δ) property. tan δ indicates how much energy is absorbed (changed into heat) by a material when it deforms. Namely, since the medium will exhibit both loss-less elastic properties and lossy viscous properties, it is important that there is a favorable high ratio of the lossy component of its viscoelasticity over the loss-less component. Namely it is preferred that the medium contributes to the overall damping coefficient of the MEMS device and that it has minor or no effect on the overall stiffness of the MEMS device.

Aspects of the present disclosure improve control of viscoelastic damping in MEMS devices by incorporating one or more fluid confinement structures on either the fixed part of the substrate and/or on the suspended element 101 (i.e. the fixed part, the suspended element or both) to confine a viscoelastic fluid in a limited part of a gap between one or more sidewalls of both the fixed part 110 of the substrate and either the suspended element 101 or the drive beam 107 or both the suspended element 101 and drive beam 107. In this way a first portion of the gap is bridged by the fluid and second portion of the gap is not so bridged. The structures are configured to prevent flow of the fluid to other parts of the gap.

The fluid confinement structures may include one or more sharp edges on either the fixed part of the substrate and/or on the suspended element configured to restrict the flow of the fluid to prevent flow of the fluid to other parts of the gap.

The sharp edges may include corners formed by one or more of the sidewalls of the fixed part of the substrate and/or the suspended element and/or the drive beam. Such corners may include one or more 90 degree corners. In some implementations, the corners may include sidewall corners of the suspended element 101 or drive beam 107 that are opposite corresponding vertical sidewall corners of the fixed part 110 of the substrate. Other possible implementations include structures that protrude from or are recessed into the drive beam 107, suspended element 101 or fixed part 110 of the substrate 111 or fingers that protrude into the gap from the drive beam 107, suspended element 101 or fixed part 110 of the substrate 111.

In some implementations, a region of the fixed part 110 of the substrate may be configured to act as a reservoir for the viscoelastic fluid so that the fluid can flow from the larger reservoir to the gap until the limited part of the gap is filled with the viscoelastic fluid.

In other implementations, a winglet structure may be connected to the drive beam 107 which in part is configured to be suspended above the fixed part 110 of the substrate 111 with a vertical gap between the winglet structure and the fixed part 110 of the substrate 111 such that the suspended element is movable vertically above the fixed part of the substrate without making contact with the fixed part of the substrate. A viscoelastic fluid may be placed in the vertical gap between the winglet structure and fixed part of the substrate.

According to aspects of the present disclosure certain mechanical structures (e.g., winglets), which can be designed as part of a MEMS device structure, can increase the structure's damping in the surrounding fluid. Moreover confinement structures can be designed to confine liquids or special viscoelastic fluids in such a way that the liquids remain in place after device manufacture and provide significantly higher damping to the structure above that provided by the surrounding gas itself.

In some implementations the suspended element 101 may be formed from the substrate 111.

In some implementations the one or more flexures 104 may be formed from the substrate 111.

In some implementations the drive beam 107 may be formed from substrate 111.

In some implementations two or more of the suspended element 101, the one or more flexures 104, or the drive beam 107 may be formed from the substrate 111.

In some implementations the suspended element 101, the one or more flexures 104, and the drive beam 107 may all be formed from the substrate 111.

"Formed from the substrate" means that the respective element was originally part of the substrate and is formed using MEMS technique like etching.

In some implementations the limited part of the gap may correspond to no more than 20% of an outline of the suspended element, the flexures, and drive beam.

In some implementations, devices in accordance with aspects of the present disclosure may further include a structure configured to confine the viscoelastic fluid to the limited part of the gap. Such confinement structures may include, e.g., one or more winglets that protrude into the gap from the fixed part of the substrate, the suspended element, the flexures, or the drive beam.

There are a number of ways in which the viscoelastic fluid may contact the device. By way of example, and not by way of limitation, in some implementations, the viscoelastic fluid may contact the drive beam but not the suspended element. In some such implementations, but not all, the viscoelastic fluid may contact the drive beam close to an axis of rotation of the suspended element.

There are a number of different ways in which the viscoelastic fluid may be disposed in the limited part of the gap. By way of example and not by way of limitation, a device in accordance with aspects of the present disclosure may further include a fluid reservoir formed in the fixed part of the substrate in fluid communication with the limited part of the gap via channel also formed in the fixed part of the substrate. In some such implementations, but not all, the fluid reservoir may be sized to receive the viscoelastic fluid from an applicator device that is too large to apply the viscoelastic fluid directly to the limited part of the gap and is still small enough to confine the viscoelastic fluid by capillary forces. The channel may be configured to communicate fluid from the reservoir to the gap by capillary forces.

FIG. 2 is a schematic top-view diagram of a MEMS device 200 having a suspended element 201 connected to anchors 202, 203 by torsion flexures 204 that allow the suspended element to rotate about an axis 205 and impart movement to a drive beam 207. The aforementioned components may be configured as shown in FIG. 1 and described above, e.g., with the anchors attached to a fixed part 210 of a substrate and the suspended element 201 and drive beam 207 free to move in a cavity 206 formed in the fixed part of the substrate 211. In this implementation, a viscoelastic fluid 208 is confined in the cavity 206 to a portion of a gap between the drive beam 207 and the fixed part of the substrate. Aspects of the present disclosure are not limited to this configuration, alternatively the fluid may be confined to part of a gap between the suspended element 201 and the fixed part 210 of the substrate 211. In other configurations the fluid may be confined to part of one or more gaps between the drive beam 207 and the fixed part 210 of the substrate 211 and to one or more gaps between the suspended element 201 and the fixed part 210 of the substrate 211. As noted above, rotation can be imparted to the suspended element 201 by any suitable form of actuator (not shown), e.g., electrostatic gap closing actuators, electrostatic comb-drive actuators, electromagnetic actuators, thermal actuators, and the like.

A number of variations on the device shown in FIG. 2 are possible. Specifically, one or more of the aforementioned MEMS device components may include confinement structures configured to confine the viscoelastic fluid to a limited part of the gap. FIG. 3, depicts one possible example, among others, of such a MEMS device 300. In this example, a suspended element 301 is connected to anchors 302, 303 by torsion flexures 304 that allow the suspended element to rotate about an axis 305 and impart movement to a drive beam 307. The aforementioned components may be configured as shown in FIG. 1 and FIG. 2 and described above, e.g., with the anchors attached to a fixed part 310 of a substrate 311 and the suspended element 301 and drive beam 307 free to move in a cavity 306 formed in the fixed part 310 of the substrate 311. In this implementation, a viscoelastic fluid 308 is disposed in a reservoir 309 that is connected to the cavity by a channel 312. The fluid is confined in the cavity 306 to a portion of a gap between the drive beam 307 and the fixed part of the substrate. The relatively large size of the reservoir compared to the width of the gap facilitates application of the fluid to the device and also facilitates confinement of the fluid. The degree of confinement is largely a function of the viscosity and surface tension of the fluid and the size of the channel 312 and the gap between the drive beam and fixed part of the substrate. Aspects of the present disclosure are not limited to this configuration, alternatively the fluid may be confined to part of a gap between the suspended element 301 and the substrate 311. In other configurations the fluid may be confined to part of one or more gaps between the drive beam 307 and the fixed part 310 of the substrate 311 and to one or more gaps between the suspended element 301 and the fixed part 310 of the substrate 311.

Aspects of the present disclosure include other ways of confining viscoelastic fluid in gap. Some examples are shown in FIG. 4A-4C. In these examples, viscoelastic fluid is confined to a portion of a gap between a moveable portion 407 of a MEMS device (e.g., a drive beam or suspended element or possibly both) and a fixed part 410 of a substrate. Confinement structures 409, 411, 413 are shown on both the moveable portion 407 and fixed part 410, however, in some implementations it may be sufficient for the confinement structures to be on one or the other but not necessarily both.

By way of non-limiting example, in the implementation shown in FIG. 4A, the confinement structures are in the form of structures 409 that protrude into a limited part of the gap in a direction perpendicular to an axis of the movable portion 407. The protruding structures 409 provide corners C that confine the fluid through viscoelastic forces between the fluid and the moveable portion 407 and/or the fixed part 410. By way of non-limiting example, the corners C may be right-angle corners. In the illustrate example, there are two protruding structure 409 on the moveable portion 407 and two corresponding protruding structures 409 on the fixed part 410 aligned with their counterparts on the moveable portion in a mirror-image fashion. Surface tension confines the fluid 408 to a limited part of the gap corresponding to the distance between inside corners C of the protruding structures 409.

In the non-limiting example shown in FIG. 4B, the confinement structures are in the form of recessed portions 411 of the moveable portion 407 and fixed part 410. These structures provide corners C (e.g., right angle corners) that confine the fluid through viscoelastic forces between the fluid and the moveable portion 407 and/or the fixed part 410. In the illustrate example, there are two recessed portions on the moveable portion 407 and two corresponding recessed portions 411 on the fixed part 410 aligned with their counterparts on the moveable portion in a mirror-image fashion. Surface tension confines the fluid 408 to a length of the gap corresponding to the distance between inside corners C of the recessed portions 411.

The non-limiting example shown in FIG. 4C is a variation on the example of FIG. 4B. Here the confinement structures are in the form of a single protruding structure 413 on the moveable portion 407 and a corresponding mirror image protruding structure on the fixed part 410. These structures 413 provide corners C (e.g., right angle corners) that confine the fluid through viscoelastic forces between the fluid and the moveable portion 407 and/or the fixed part 410. Surface tension confines the fluid 408 to a length of the protruding structures 413 between outside corners C.

FIG. 5 illustrates a MEMS device 500 incorporating another variation on the concepts illustrated in FIGS. 4A-4C. In this implementation, a suspended element 501 is connected to anchors 502, 503 on a fixed part 510 of a substrate by torsion flexures 504 that allow the suspended element to rotate about an axis 505 and impart movement to a drive beam 507. The aforementioned components may be configured as shown in FIG. 1, FIG. 2 and FIG. 3 and as described above, e.g., with a drive beam 507 free to move in a cavity 506 formed in a fixed part 510 of a substrate. Here one or more fluid confinement structures include recessed portions 511 of the sidewall of the fixed part 510 of the substrate. The recessed structures 511 form an extension of a gap between the drive beam 507 and the fixed part 510. One or more structures 513 protrude from the drive beam into a limited part of a gap defined by the recessed structures 511. Viscoelastic fluid 508 is disposed in the limited part of the gap and is confined between ends of the protruding structures 513 and nearby sidewalls of the fixed part 510 corresponding to the recessed structures.

In FIG. 5, the device 500 is depicted with potential locations for inclusion of winglet structures 513. The drive beam 507, which actuates another part of a device (not pictured), has two winglets, 513 attached to it. By way of example, and not by way of limitation, the winglets may be manufactured in the same steps as the rest of the structure and may be monolithically integral part of it, their thickness (into the page of the figure) would also be the same as the rest of the rotator and would be defined by the silicon layer thickness. The moving portion of a winglet may be fully suspended over the portion of the etched cavity 506 corresponding to the recessed structures 511 to allow out-of-plane movement.

FIG. 6 illustrates a MEMS device 600 incorporating another variation on the concepts illustrated in FIGS. 4A-4C and FIG. 5. In this implementation, a suspended element 601 is connected to anchors 602, 603 on a fixed part 610 of a substrate by torsion flexures 604 that allow the suspended element to rotate about an axis 605 and impart movement to a drive beam 607. The aforementioned components may be configured as shown in FIG. 1, FIG. 2 and FIG. 3 and as described above, e.g., with a drive beam 607 free to move in a cavity 606 formed in a fixed part 610 of a substrate. Here, the one or more fluid confinement structures include one or more beams 613 that protrude into the limited part of the gap 611 from the suspended element in a direction perpendicular to the axis 605 on an opposite side of the suspended element from the drive beam 607. Viscoelastic fluid 608 is confined between an end 614 of the beam 613 and a nearby vertical sidewall of the fixed part 610 in this example.

The design illustrated in FIG. 6 may be practical to add such structures for applications where it is desirable not to interfere with the drive beam 507 and its attachment to an actuated device (e.g. a micromirror). The portion of the etched cavity 606, corresponding to the gap 611 may extended underneath the beam 613 to allow for out-of-plane movement.

FIG. 7 illustrates a MEMS device 700 incorporating yet another variation on the concepts illustrated in FIGS. 4A-4C, FIG. 5, and FIG. 6. In this implementation, a suspended element 701 is connected to anchors 702, 703 on a fixed part 710 of a substrate by torsion flexures 704 that allow the suspended element to rotate about an axis 605 and impart movement to a drive beam 707. The aforementioned components may be configured as shown in FIG. 1, FIG. 2 and FIG. 3 and as described above, e.g., with a drive beam 707 free to move in a cavity 706 formed in a fixed part 710 of a substrate. Here the one or more fluid confinement structures include a plurality of fingers 714 that protrude from a beam 713 that extends into a limited portion of the gap 711 from the suspended element 701 in a direction perpendicular to the axis 705 on a side of the suspended element opposite the drive beam 707. The fingers 714 are configured to entrain a portion of viscoelastic fluid 708 next to a vertical sidewall of the fixed part 710 and between adjacent fingers of the plurality of fingers 714. In alternative implementations the fingers 714 may extend from the drive beam 707, or the fixed part 710 or some combination of two or more of the suspended element, the drive beam and the fixed part.

In the device 700, in the example depicted in FIG. 7 the beam 713 is not used as the drive beam and the comb fingers 714 can be on its sides as depicted or at its end. The fingers 714 act as damping structures, and portion of the etched cavity 706 corresponding to the gap 711 may extend underneath the suspended element 710, beam 713 and fingers 714 to allow for out-of-plane movement.

There are a number of variations on the design of the fluid confinement structures that may be used in the implementation shown in FIG. 7 and other implementations. FIGS. 8A-8F illustrate a number of possible variations, among others of structure for fluid confinement and mechanical damping. Such damping structure designs aim to have a relatively large area and narrow gap as shown. In FIGS. 8A-8F, an etched cavity formed in a fixed part 810 of a substrate includes a small gap portion 811 that surrounds an end of a beam 813 configured similarly to the beam 713 in FIG. 7. The beam may be connected to a suspended element that is in turn anchored to the fixed part 810, which may be part of a silicon layer.

FIG. 8A depicts a T-shaped damping structure 814A attached to the beam 813 within the gap portion 811 of the cavity. The beam 813 with the T-shaped structure may be directly connected to a suspended element, e.g., as shown in FIG. 7 and the cavity and gap portion may be configured so that the suspended element, beam, and damping structure can have out-of-plane movement. Viscoelastic fluid 808 may be confined to the gap portion 811 of the etched cavity. By providing for moving and non-moving surfaces and a narrow gap between them, a significantly higher fluid drag can be obtained to increase damping.

The device of claim 1, wherein the one or more fluid confinement structures include one or more Y-shaped structures formed on the drive beam or the suspended element.

FIG. 8B depicts an example of a Y-shaped damping structure 814B within a modified gap portion 811 of the etched cavity. The gap portion 811 has been etched so that there is a uniform narrow gap between the Y-shaped damping structure 814B and the surrounding fixed part 810 along the length of the damping structure.

FIG. 8C schematically illustrates an example that uses a rectangular damping structure 814C with an array of small holes etched through it. As a result of the holes, there is an increased surface area of the winglet that is exposed to the surrounding fluid and therefore higher fluid drag. The gap portion has been etched so that there is a uniform narrow gap between the outer edges of the rectangular structure 814C and nearby fixed parts 810 of the substrate.

In FIG. 8D is a T-shaped damping structure 814D has teeth extensions 815 within a modified gap portion 811 of the etched cavity. The teeth extensions 815 significantly increase the surface area of the damping structure 814D that is exposed to the surrounding fluid 808, resulting in higher fluid drag.

As shown in FIG. 8E damping structure 814E similar to the one shown in FIG. 8D may further include teeth 816 extending from the fixed part that interdigitate with the teeth 815 on the damping structure 814E. This addition effectively narrows the gap between the damping structure 814E and the fixed part 810, resulting in stronger surface forces and higher fluid drag.

FIG. 8F is a schematic top-view diagram showing a proposed rectangular damping structure 814F within a modified gap portion 811 of the etched cavity. The rectangular winglet utilizes a smaller surface area without sacrificing the narrow gap and therefore high fluid drag, and may be versatile for devices with smaller structures.

Figure 9:
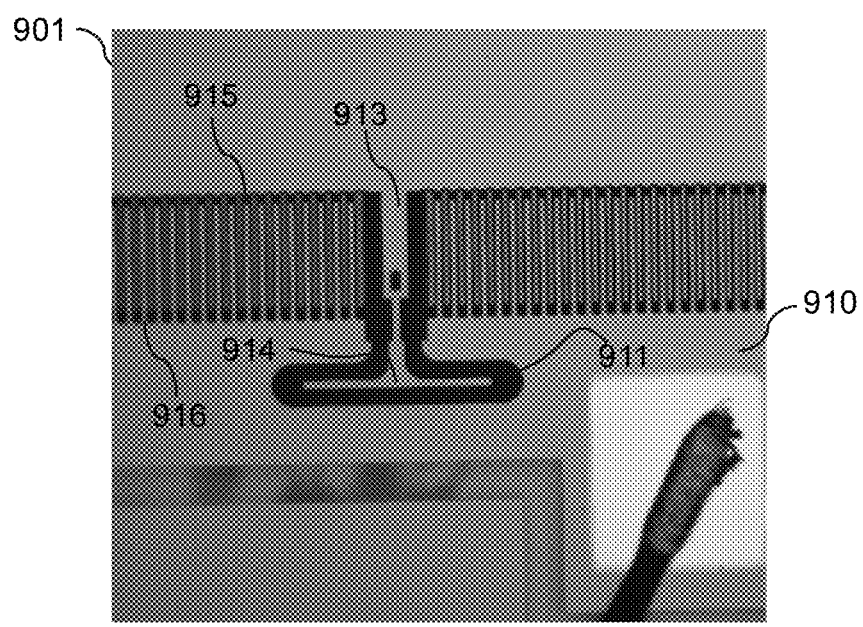
FIG. 9 is a photo-micrograph of a portion of a MEMS device utilizing a T-shaped damping structure in accordance with certain aspects of the present disclosure.

There are a number of ways in which the suspended element may be actuated in MEMS devices in accordance with aspects of the present disclosure. By way of example, and not by way of limitation, FIG. 9 is a photomicrograph of an example embodiment in which a combdrive actuator and a T-shaped damping structure 914 are attached to a suspended element 901 by a beam 913. The damping structure moves in a portion 911 of a cavity etched in a fixed part 910 of a substrate. The combdrive includes comb fingers 915 extending from the suspended element that interdigitate with comb fingers 916 that extend from nearby portions of a fixed part 910.

FIGS. 10A-10C depict some possible variations on the design shown in FIG. 8A. Specifically, FIG. 10A is a schematic top-view diagram of a portion of a MEMS device in which a T-shaped damping structure 1014 similar to that shown in FIG. 8A is attached to a beam 1013. In this example, fluid 1008 is laterally confined within the indicated area by careful design of the damping structure, using strong surface forces between the fluid and the silicon sidewalls of a gap portion 1011 of a cavity formed within a fixed part 1010 of a substrate. Namely the strong forces aim to keep the fluid confined within the narrow uniform gap section and do not easily spill beyond the edges where the gap is changed. In the depth direction, the fluid 1008 is also confined by the thickness of the structure itself (silicon device layer) since the top and bottom of the structure have sudden gap increases with sharp angles.

FIG. 10B is a schematic top-view diagram of a portion of MEMS device similar to that shown in FIG. 10A in which the damping structure 1014 is fully immersed in viscoelastic fluid 1008, and both the damping structure 1014 and fluid 1008 are suspended within the gap portion 1011 of the etched cavity. As in the example shown in FIG. 10A, the fluid 1008 is laterally confined within the indicated area by careful design of the damping structure 1014 and the portion 1011 of the cavity, and is vertically confined by the thickness of the structure. Strong surface forces at the narrow uniform gap sections between the winglet-shaped part of damping structure 1014 and surrounding fixed part 1010 near the intersection of the beam 1013 and damping structure 1014 keep the fluid 1008 laterally confined. The head of the damping structure in FIG. 10B is modified with smooth and round edges to ensure it is laterally fully immersed in the fluid 1008.

FIG. 10C illustrates an example similar to that shown in FIG. 10B but in which the fixed part 1010 includes a reservoir 1009 in fluid communication with the gap portion of the cavity via a fluid channel. The size and location of the reservoir and the dimensions of the channel may be chosen to facilitate dispensing of fluid and communication of the fluid from the reservoir to the gap portion by capillary forces.

Aspects of the present disclosure include implementations in which the damping structure is configured to enhance vertical damping forces. By way of example, and not by way of limitation, FIGS. 11A-11C depict an implementation of a portion of a MEMS device in which a suspended element 1101 is connected to anchors 1102, 1103 on a fixed part 1110 of a substrate by torsion flexures 1104 that allow the suspended element to rotate about an axis 1105 and impart movement to a drive beam 1107. The aforementioned components may be configured as shown in FIGS. 1-3 and FIG. 5 and as described above, e.g., with a drive beam 1107 free to move in a cavity 1106 formed in a fixed part 1110 of a substrate. Here one or more fluid confinement structures include recessed portions 1111 of the sidewall of the fixed part 1110 of the substrate that communicate with the cavity 1106. The recessed structures 1111 form an extension of a gap between the drive beam 1107 and the fixed part 1110. One or more winglet structures 1113 protrude from the drive beam into a limited part of recessed structures 1111. Viscoelastic fluid 1108 is disposed in a gap portion defined by the recessed structures 1111 and is confined between ends of the winglet structures 1113 and nearby vertical and horizontal sidewalls of the fixed part 1110 corresponding to the gap portion. As may be seen in the cross-sectional view in FIG. 11B and the three-dimensional view in FIG. 11C, the fluid 1108 is disposed at least partly underneath the winglet structures 1113, which encounter vertical damping forces when undergoing vertical motion (i.e., motion into the plane of FIG. 11A.

Figure 12:
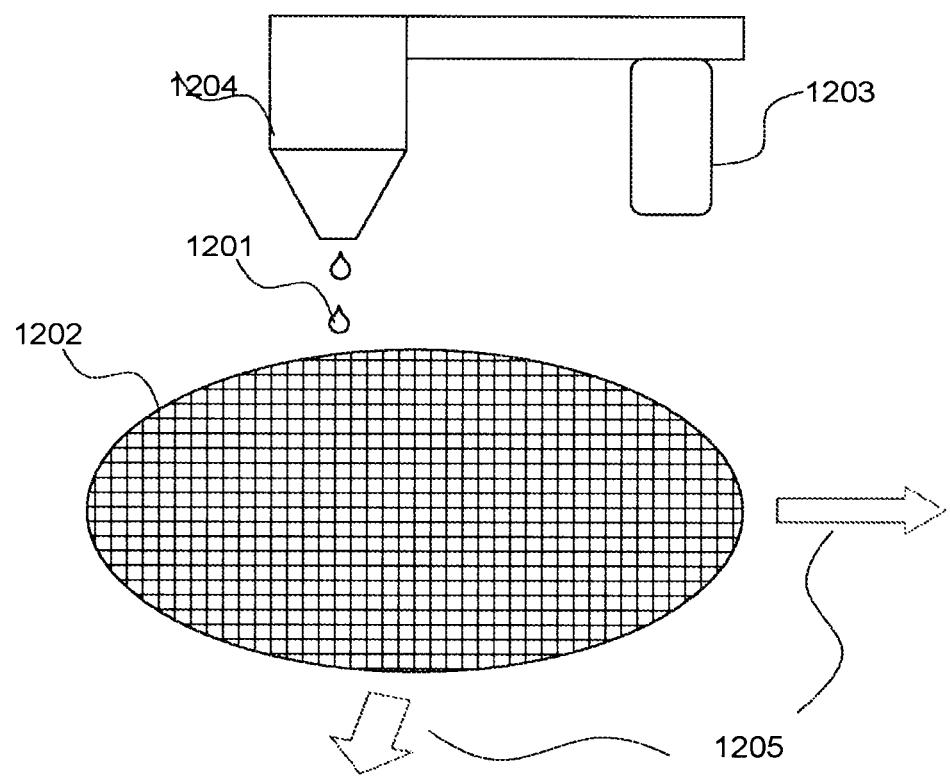
FIG. 12A is a schematic diagram showing a technique to dispense viscoelastic fluids onto specific microstructures on an entire wafer by the use of a contact-less droplet ejection method and a programmable wafer positioning stage in accordance with certain aspects of the present disclosure.
FIG. 12B is a schematically shown technique to dispense viscoelastic fluids onto specific portions of a die by the use of a contact-less droplet ejection method and a programmable or manually positioned stage in accordance with certain aspects of the present disclosure.
Figure 12:
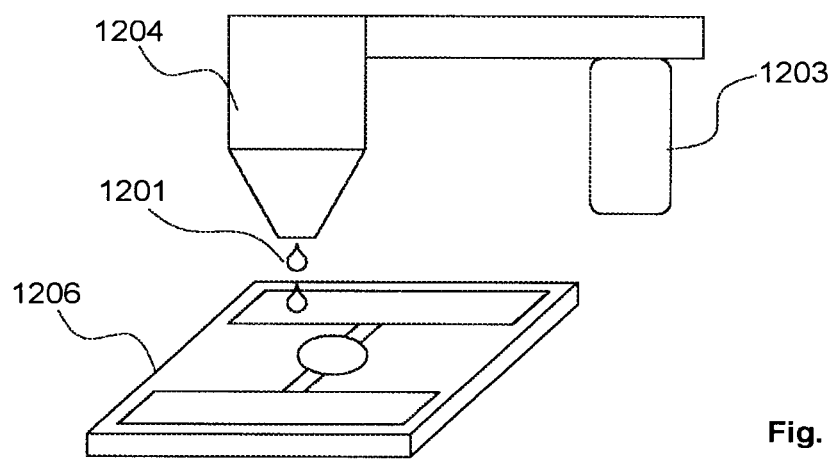

As noted above, viscoelastic fluid may be dispensed into a gap portion or nearby reservoir. FIG. 12A is a schematic diagram illustrating a dispensing technique used to deliver droplets of viscoelastic fluid 1201 to an entire wafer 1202. Initially stored in a reservoir 1203, the fluid is deposited via contact-less droplet ejection method through a dispenser head 1204 onto the wafer. The wafer is mounted on a stage 1205 that allows for its biaxial lateral movement. Manual movement of the stage is possible; however, for a more precise droplet ejection, an automated machine can be programmed to dispense exact pico-liter droplets of viscoelastic fluid 1201 on particular locations on the wafer 1202.

FIG. 12B is a schematic of the dispensing technique used to deliver viscoelastic fluid 801 to specific portions of a die 1206. Similarly to FIG. 12A, the fluid is initially stored in a reservoir 1203 and deposited via contact-less droplet ejection method through a dispenser head 1204. The die 1206 is mounted on a stage that allows for biaxial lateral movement to correctly position the dispensing device, and the stage can be manually repositioned or programmed for biaxial lateral movement to deposit droplets in the correct location.

Fluid dispensing systems like, e.g., the jetlab 4® printing system from MicroFab Technologies, Inc. of Plano Tex. or the he BioJet Ultra™ Piezo Dispenser MD-K-140 from Biodot Inc of Irvine, Calif. are widely available commerically, and have been used for applications such as serial dilution of picoliter drops of fluid. Presently these products can dispense fluids of lower viscosity not exceeding 20 centipoise (cP). Viscoelastic fluids exceeding these parameters may still be dispensed via these methods after their preparation by preheating or premixing with solvents to lower their viscosity as they are ejected from the dispensing device.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause. Although certain process steps may appear in a certain order in the claims, the steps are not required to be carried out in any particular order unless a particular order is otherwise specified by the claim language.

The invention claimed is:

1. A MEMS device, comprising:
   a substrate;
   a suspended element connected to a fixed part of the substrate by one or more flexures,
   wherein the one or more flexures are configured to permit movement of the suspended element relative to a fixed part of the substrate;
   an actuator coupled to the suspended element;
   a damping structure coupled to the suspended element extending into a gap between the suspended element and the fixed part of the substrate; and
   one or more fluid confinement structures configured to permit movement of the damping structure within a limited portion of the gap and to confine a viscoelastic fluid to the limited portion of the gap.

2. The device of claim 1 further comprising a beam attached to the suspended element and the dampening structure, whereby the beam couples the damping structure to the suspended element.

3. The device of claim 1, wherein the one or more fluid confinement structures include one or more sharp edges on either the fixed part of the substrate and/or on the suspended element configured to restrict flow of fluid to prevent flow of the viscoelastic fluid to other parts of the gap.

4. The device of claim 3, wherein the one or more sharp edges include one or more corners formed by one or more sidewalls of the fixed part of the substrate and/or the suspended element and/or a beam attached to the damping structure and the suspended element.

5. The device of claim 4, wherein the one or more corners include one or more 90 degree corners.

6. The device of claim 4, wherein the one or more corners include one or more corners of a sidewall of the suspended element opposite one or more corresponding corners of a sidewall of the fixed part.

7. The device of claim 6, wherein the one or more corners include one or more corners of a sidewall of a beam opposite one or more corresponding corners of a sidewall of the fixed part of the substrate, wherein the beam is attached to the damping structure and the suspended element.

8. The device of claim 7, wherein the one or more corners include one or more corners of a sidewall of the beam opposite one or more corresponding corners of a sidewall of the fixed part of the substrate.

9. The device of claim 1, wherein the one or more fluid confinement structures include one or more structures that protrude into the gap from the suspended element and/or the fixed part and/or a beam attached to the damping structure and the suspended element.

10. The device of claim 1, wherein the one or more fluid confinement structures include one or more recessed portions of a beam attached to the damping structure and the suspended element, the suspended element, or the fixed part of the substrate or some combination of two or more of these.

11. The device of claim 2, wherein the dampening structure includes one or more structures that protrude into the limited portion of the gap from the beam in a direction perpendicular to an axis thereof.

12. The device of claim 2, wherein the damping structure includes one or more structures that protrude into the limited portion of the gap from the suspended element in a direction perpendicular to an axis of the beam.

13. The device of claim 1, wherein the damping structure includes a plurality of fingers that protrude into the gap from a beam attached to the suspended element, and/or the suspended element, and/or the fixed part of the substrate, wherein the fingers are configured to entrain a portion of the viscoelastic fluid between adjacent fingers of the plurality of fingers.

14. The device of claim 1, wherein the damping structure includes one or more openings formed through a beam attached the suspended element, or the suspended element.

15. The device of claim 1, wherein the damping structure include one or more T-shaped structures formed on a beam attached the suspended element, or the suspended element.

16. The device of claim 1, wherein the damping structure include one or more Y-shaped structures formed on a beam attached to the suspended element, or the suspended element.

17. The device of claim 1, wherein the actuator is an electrostatic gap closing actuator, an electrostatic comb-drive actuator, an electromagnetic actuator or a thermal actuator.

18. The device of claim 1, wherein the actuator is formed from the substrate.

19. The device of claim 1, wherein the suspended element is formed from the substrate.

20. The device of claim 1, wherein the one or more flexures are formed from the substrate.

21. The device of claim 1, wherein the damping structure is formed from the substrate.

22. The device of claim 1, wherein two or more of the suspended element, the one or more flexures, the actuator, or the damping structure are formed from the substrate.

23. The device of claim 1, wherein the suspended element, the one or more flexures, the actuator, and the damping structure are all formed from the substrate.

24. The device of claim 1, wherein the actuator is a comb-drive including comb-drive fingers that extend from the suspended element extending into portion of the fixed part.

25. The device of claim 24, wherein the fixed part includes fixed part fingers that interdigitate with the comb-drive fingers.

26. The device of claim 1, wherein the damping structure includes one or more winglets that protrude into the gap from the fixed part of the substrate, the suspended element, the flexures, or a beam attached to the suspended element.

27. The device of claim 1, wherein the viscoelastic fluid contacts a beam attached to the suspended element and wherein the viscoelastic fluid does not contact the suspended element.

28. The device of claim 27, wherein the viscoelastic fluid contacts the beam close to an axis of rotation of the suspended element.

29. The device of claim 1, further comprising a fluid reservoir formed in the fixed part of the substrate in fluid communication with the limited part of the gap via channel also formed in the fixed part of the substrate.

30. The device of claim 29, wherein the fluid reservoir is sized to receive the viscoelastic fluid from an applicator device that is too large to apply the viscoelastic fluid directly to the limited part of the gap.

31. The device of claim 29, wherein the channel is configured to communicate fluid from the reservoir to the gap by capillary forces.

32. The device of claim 1, further comprising a viscoelastic fluid disposed in the limited portion of the gap.

33. The device of claim 32, wherein a first portion of the gap is bridged by the viscoelastic fluid and a second portion of the gap is not.

* * * * *